United States Patent

Spratt

[11] Patent Number: 5,900,654
[45] Date of Patent: May 4, 1999

[54] RADIATION HARDENED CHARGE COUPLED DEVICE

[76] Inventor: James P. Spratt, 2728 Llama Ct., Carlsbad, Calif. 92009

[21] Appl. No.: 08/503,104

[22] Filed: Jul. 17, 1995

[51] Int. Cl.$^6$ .......... H01L 27/148; H01L 29/768
[52] U.S. Cl. .......... 257/222; 257/216; 257/228; 257/250
[58] Field of Search .......... 257/228, 231, 257/232, 233, 234, 250, 216, 222

[56] References Cited

U.S. PATENT DOCUMENTS

| | | | |
|---|---|---|---|
| 4,313,127 | 1/1982 | Su et al. | |
| 4,774,557 | 9/1988 | Kosonocky. | |
| 5,220,185 | 6/1993 | Wada. | |
| 5,280,186 | 1/1994 | Lee | 257/232 |
| 5,334,867 | 8/1994 | Shin et al. | 257/222 |
| 5,426,317 | 6/1995 | Hirota | 257/230 |
| 5,495,116 | 2/1996 | Funakushi et al. | 257/239 |

OTHER PUBLICATIONS

M. S. Saks et al; IEEE Transactions on Nuclear Science, NS–26; 12–1997; pp. 5074–5079.
Sarnoff Res. Ctr., "High Resolution UV CCE" Aug.–1992; pp. 0–46.

*Primary Examiner*—Ngân V. Ngô
*Attorney, Agent, or Firm*—Robert R. Meads

[57] ABSTRACT

A structure and method is described for fabricating a nuclear radiation induced damage resistant P-type buried channel charge-coupled device (P-BCD) which converts an optical image focused thereon into a time varying electrical signal. The invention uses a differentially related high level dosing of dopant in the buried channel accompanied by processing at minimum effective temperatures, thereby enhancing device tolerance to exposure to nuclear radiation induced displacement and ionization damage which otherwise would degrade the imaging performance of the device.

14 Claims, 5 Drawing Sheets

NORMALIZED CHARGE LOSS v NORMALIZED TIME

RADIATION HARDENED CHARGE COUPLED DEVICE

BACKGROUND OF THE INVENTION

The present invention relates to a nuclear radiation induced displacement and ionization damage resistant semiconductor device which converts an optical image focused thereon into a time varying electrical signal. More particularly, it relates to a P-type buried channel charge-coupled device (P-BCD) which is uniquely doped and processed at minimum effective processing temperatures thereby enhancing device tolerance to exposure to nuclear radiation which otherwise would degrade the imaging performance of the device.

Electro-optical systems designed to sense images function by converting a spatially varying pattern of incident illumination falling upon a photo-sensitive surface into a time-varying electrical signal. The earliest such systems were mechanical scanners in which each picture element (pixel) was presented sequentially to an individual detector by means of rotating mirrors. The output of the detector was then a time-serial representation of the scene. Such imagers suffer from the fact that the detector is sensitive to photons from a given part of the scene only when that pixel is addressing the detector. If the scene being imaged consists of a large number of pixels, very poor overall sensitivity results.

Another class of imagers widely used in visible imaging, described in "Photoelectronic Imaging Devices" edited by L. M. Biberman and S. Nudelman (Plenum Press 1971), employs a position-controlled electron beam moving across a photo-sensitive surface in a raster fashion to detect an image focused onto that surface. Electron beams serve as nearly perfect commutator switches, sampling each of a plurality of pixels of the image in a time sequential manner. The surfaces used in such systems usually operate in a storage mode. In such a storage mode the photosensitive surface is charged by the scanning beam to a specified potential, which, in the absence of light, will be retained for a long time; that is until leakage processes give rise to a current, called "dark current", which discharges the surface. As long as the surface remains at the specified potential, it will accept no additional charge from the scanning beam.

However, light incident on the surface can give rise to currents which will discharge it, so that the beam current required to recharge it on the next pass is then proportional to the integrated photon flux incident on the photosensitive surface since the last pass. Such imagers are much more sensitive than those not using the storage mode, since the photosensitive surface is equivalent to many individual detectors, and all the light is detected, not just that incident during the brief interrogation period. All modern imagers employ this type of photon flux integration to exploit the sensitivity improvement which this mode of operation offers.

Both mechanical and electron beam scanners, however, have numerous disadvantages, and as a result, technologists have developed solid-state imaging systems using arrays of photosensitive elements for which the scanning function is accomplished by the application of electrical signals to interrogate one pixel at a time. Such scanning systems use several electrical control signals, with all electrodes of one type in an array being at the same voltage during one phase of the scanning cycle, and at a different voltage during other phases. In a carryover from electron beam tubes, such imagers operate the basic photosensitive device in the storage mode to enhance sensitivity. In addition to detection, self-scanned arrays also perform other signal processing functions, such as amplification, time delay and integration (TDI), multiplexing, anti blooming, background signal subtraction, etc. The material of choice for performing electronic functions such as these is silicon. When the spectral band in which imaging is to be done is one in which silicon can also serve as the photosensitive element, there is an ideal match, and the rapid progress in recent years in solid-state imagers for the visible spectrum attests to this fact.

Charge-coupled device (CCD) imagers are a particularly simple version of self-scanned solid state imagers and are described in "Imaging Devices Using the Charge-coupled Concept", by D. F. Barbe, Proceedings of the IEEE, Vol. 63, 38–67, January 1976. In the CCD imagers, each pixel consists of a metal-insulator semiconductor (MIS) structure, which, under appropriate bias voltages, establishes a potential minimum (well) in the semiconductor. When light is absorbed in the semiconductor, generating electron-hole pairs therein, minority carriers collect in charge packets at this potential well, while majority carriers are swept into the body of the semiconductor and merge with background carriers already there. The imager consists of a large array of such pixels, and thus can transfer charge packets in discrete time increments from one pixel to the next by forming a new potential well adjacent to the one holding the charge packet, and then eliminating the old well by changing the bias voltages that established it. Since the charge packets follow the potential wells, which are controlled by external voltages presented to the CCD array in various phases, transfer can be achieved in two spatial dimensions, and a two dimensional image achieved.

A CCD array is divided into vertical columns by channel stop diffusions, while electrodes running across the array at right angles to the channel stops divide the array into horizontal lines. In one version of the CCD imager, the electrodes are grouped into two sections: an integration section, in which the photon integration process takes place, and a storage section, in which the minority carrier packets are stored while being transferred to the output in a serial fashion. A horizontal readout register allows serial readout of data from the storage section. Both the storage section and the readout register are shielded from light, to prevent additional generation of carriers during the readout process.

In use, an image is focused on the optical integration section. Each pixel therein consists of several electrodes on which different voltages are applied to control the electrical potential in the semiconductor thereunder. The primary electrode of each pixel is held at a suitable voltage during a first phase of the control signal and the charge generated in the silicon by the incident light is separated by the fields existing therein. The minority carriers are swept into the potential wells beneath these electrodes and the majority carriers swept into the bulk silicon where they merge with the background carriers. Minority carriers generated by thermal processes are also swept into these potential wells, and comprise the "dark current", minimization of which is critical to successful CCD operation. To maintain the signal charges in the region where they were first generated each pixel is bounded in the direction of scan by other electrodes maintained at voltages which will not give rise to potential wells in the semiconductor, and in the direction perpendicular to the scan by the channel stop diffusions, that is regions of the semiconductor in which minority carriers are permanently prevented from entering by impurity atoms added during CCD manufacture. The amount of photon-generated charge collected in any given pixel is directly proportional to the number of photons incident on that pixel during the time over which light is integrated (the frame time), with a constant of proportionality being referred to as the quantum efficiency, "η", usually considered to be spatially uniform over the array.

At the end of a relatively long integration period, the collected charges are transferred into the storage section in a short period of time by applying suitable clock pulses between a primary electrode and a plurality of secondary electrodes associated with each pixel in both the integration and storage sections. The secondary electrodes of each pixel which has been biased at voltages which constrain minority carriers from collecting under them are now biased at voltages such that potential minima form under them. Simultaneously, the bias voltage of the primary electrode is changed to a voltage such that the signal carriers are moved to the adjacent secondary electrode. By a sequence of such steps, the potential wells are moved toward the output register and the charge packets follow. Once the charge in each pixel in the integration section has been moved into the storage section, a new integration period or frame begins in the image section. During the new frame, while a new image is being integrated in the integration section, the charge constituting the first frame is moved, one line at a time, from the storage section into a serial readout register, and transferred horizontally to an output stage. The efficiency of charge transfer during each such step is called the Charge Transfer Efficiency (CTE), and is a critical parameter for CCDs. The signal arriving at the output at the time $t_{ij}$ is thus proportional to the light that fell on pixel ij during a particular frame, unless the transfer process causes charges to be delayed and become confused with a signal from pixel (i+1)j.

Electronic cameras featuring CCD imagers are used in a variety of military, scientific, medical, commercial, and consumer applications. For example, cam corders use a CCD imager. However, CCD vulnerability to nuclear radiation limits their use in important areas such as space surveillance, nuclear waste handling, scientific instrumentation, etc. During their early development period through the 1970s and 1980s, CCDs were found to suffer from the same radiation damage mechanisms which afflict other semiconductor devices using metal-insulator semiconductor (MIS) configurations, that is the buildup of electrical charge in the insulating layer and of surface states at silicon-insulator interfaces as a result of exposure to ionizing radiation. Early radiation effects research and development concentrated on such problems, and substantial progress was made in improving the CCD resistance to ionizing radiation, exposure to which is measured in terms of the total dose of ionizing radiation that has been absorbed, total dose usually being measured in rads (silicon).

As described in "CCDs in Astronomy" by J. Janesick, et al, Astronomical Society of the Pacific, Volume 8, Chapter 4, September 1989, as semiconductor fabrication technology advanced, larger arrays of pixels became possible which required that the minority carriers making up the charge packets be transported greater distances from a pixel site to the output gate (≈1 cm, in some cases) without loss or delay. This imposed a requirement that did not apply to other MIS devices, that is that defects in the semiconductor capable of capturing and delaying minority carriers (called charge traps) be virtually eliminated from the silicon. Such traps degrade the Charge Transfer Efficiency, CTE, a parameter unique to CCD devices. CTE is usually very close to 1, so that it is easier described in terms of the Charge Transfer Inefficiency, CTI, which is defined as 1-CTE.

Process technologists have succeeded in reducing bulk defect concentrations to low levels in virgin devices. However, damage produced by nuclear radiation generates new crystalline defects, which serve as traps. The radiation damage mechanism which produces traps is called displacement damage, since it involves displacing a crystalline silicon atom from its position in the crystal lattice and forcing it into a position which it would not normally occupy. Displacement damage is different from ionization damage, but both can result from exposure to certain types of nuclear radiation. Because of the sensitivity of current CCD designs to radiation-induced charge traps, they are rendered unusable for some applications by radiation fluences which would be negligible by less demanding standards.

All modern CCD imagers take advantage of the fact that when electrons are the carrier in the charge packets, they move faster than their counterpart, holes. Thus, manufacturers of CCDs start with silicon which is P-type where electrical conduction is by the majority carrier, holes, which are positive carriers. Furthermore, the material used as the insulator in the metal insulator semiconductor (MIS) structure of which CCDs consist is silicon dioxide. These structures are then referred to as metal oxide semiconductor (MOS) devices, where MOS devices are a subset of MIS devices. Critical manufacturing decisions such as the specific insulator to be used, and the conductivity type of the starting material which will be employed determine many of the effects of nuclear radiation on the CCDs.

In order to understand the present invention it is important to consider briefly the details of nuclear radiation damage in CCDs. There is a large body of data on the response of CCDs to nuclear radiation, most of it gathered by space experimenters concerned about the naturally occurring nuclear radiation environment, see for example, SPIE Proceedings, February 1991, Volume 1447, Pages 70–86 by C. J. Dale and P. Marshall and Pages 87–108, by J. Janesick. To understand these data, consider the nature of the interactions between nuclear radiation and matter. When nuclear radiation passes through solids, energy is lost, either through ionization of the solids, or through non-ionizing energy loss (NIEL), i.e. atomic displacements. Most nuclear radiation types cause both types of damage and the partitioning between ionization and NIEL determines the mechanisms which dominate in any given environment. One MeV protons will displace about 0.5 atoms/proton in silicon and will deposit of the order of 1 Krad (Si) in ionization for 1E8 protons/sq cm. For most MOS structures, even unhardened commercial devices, 1 Krad will cause little degradation of device parameters. However, for large format CCDs, 5E7 defects/sq cm will degrade CTE by an unacceptable amount. Thus, in a proton environment, displacement damage will be a much greater threat than ionization. In a soft X-ray environment, on the other hand, displacement damage in silicon is energetically impossible, and ionization damage is the only concern. Intermediate between these extremes is the case of hard gamma rays such as those emitted by fission products. These photons can cause atomic displacements in silicon, yet their primary energy loss mechanism is electronic excitation. Since both displacement damage and ionization damage usually occur simultaneously, CCDs intended for use in a radiation environment must have "balanced" hardening, that is they must be hardened against damage mechanisms arising from both. Radiation effects scientists have made significant progress in hardening CCDs against total dose damage, but little in displacement damage hardening.

Several techniques exist for hardening CCDs against total ionizing dose, for example structural optimization, hardened circuit design, radiation tolerant operational procedures, and, finally, hardening of the manufacturing process used to build the device. Most of these require implementation by the manufacturer of the CCD, but manufacturers have been reluctant to implement them, since almost all applications for radiation hardened CCDs also require displacement damage hardening for which no techniques have been developed. The market for radiation hardened CCDs is not large enough to justify even minor changes in procedures if the resultant products are still unable to satisfy the customer's requirements. Total dose hardening methods must be understood, however, because the methods developed for displacement damage hardening must be compatible with them if balanced hardening is to be achieved.

The most succinct description of the technology for total dose hardening of CCDs is contained in a paper by N. S. Saks, et al in IEEE Transactions on Nuclear Science, NS-26, Pages 5074 et seq, December 1979. These authors built and tested CCDs in which the minority carriers making up the charge packets were holes, rather than electrons as used in most CCD imagers. Also, they used a construction technique in which the potential minimum was formed slightly below the silicon-silicon dioxide interface to avoid radiation-induced damage which concentrates at the interface. Their structures, called P buried channel CCDs (P-BCDs) used $SiO_2/Si_3N_4$ gate insulators and show that devices made in this way did indeed have superior total dose hardness.

Unfortunately, imaging CCDs have never been fabricated with this technology so its advantages in nuclear hardness have never been verified. However, it will be shown that the Saks procedures are compatible with the new fabrication procedures, recommended for displacement damage hardness, which are the substance of this invention. Thus, balanced hardness can be achieved by the use of P-BCDs, modified as discussed below.

While most interactions between energetic particles and atoms in a solid transfer energy to an electron cloud causing excitation or ionization, a small fraction displace nuclei from their equilibrium positions in the lattice producing a displaced atom which occupies an interstitial position in the lattice and a vacancy comprising the lattice position formerly occupied by the displaced atom. These displaced nuclei are called primary knock-on atoms (PKAs). PKAs can produce additional vacancy-interstitial pairs by further collisions and if they are generated with sufficient energy, damage cascades will be formed. The fraction of the PKA energy that is dissipated in the production of displacements can be determined from the theory of energy partition.

Regardless of whether an atom is displaced as part of a damage cascade or as an isolated PKA, most of the vacancy-interstitial pairs produced annihilate each other by recombining with no permanent damage resulting. The vacancies that escape direct recombination migrate through the lattice and ultimately combine with other lattice anomalies forming one of the several possible stable defects that are capable of trapping minority carriers in silicon. For example, two vacancies may combine to form a divacancy which is stable up to about 300° C. or a vacancy and a phosphorous (or oxygen) atom may form an E center (or A center) which is stable up to about 150° C. (or 350° C.). The vacancy itself is mobile at temperatures above 100° K, and silicon crystals contain enough of the anomalies capable of combining with these vacancies to permit formation of stable defects for levels of radiation of common interest.

The importance of a given defect depends on the device characteristic being measured (i.e. dark current, CTE, etc.), and the density and electrical properties of the defect. For many applications, CTE degradation resulting from trapping of signal carriers at radiation-induced defects is the most serious problem arising from displacement damage. Analysis of the effect of radiation-induced traps on CTE shows that CCDs in which the minority carriers are electrons are adversely affected by two main classes of traps: (1) the divacancy formed when two vacancies combine to form a stable configuration and (2) the E-center formed when a vacancy and a phosphorous atom combine to form a stable configuration. These two traps are important in N-CCDs since either can trap an electron and hold it long enough to delay it relative to the main body of charge in a packet. However, in P-CCDs, the important trap would be the divacancy, since it is the only trap able to trap holes.

SUMMARY OF THE INVENTION

The present invention provides devices to form a CCD imager which is hardened against the deleterious effects of displacement damage caused by exposure to nuclear radiation. The invention is based on the use of P-CCDs, in which the signal charges are holes rather than electrons, as is the case in N-CCDs. In such CCDs, the electrical degradation produced by displacement damage is caused by divacancies rather than by E-centers which are responsible for the radiation induced degradation of N-CCDs. While E-centers and divacancies are formed by displacement damage in N-CCDs and P-CCDs, only divacancies are effective in degrading the properties of P-CCDs. E-centers are unable to affect the transport of holes in P-CCDs due to the electrical charge state of the E-center and other properties. Once the significance of the differences in the electrical properties of E-centers and divacancies are realized, one can see two different advantages in the use of P-CCDs over N-CCDs when displacement damage is a concern.

First, the amount of time during which a divacancy will trap a hole is significantly different from the amount of time during which an E-center will trap an electron. Trapping that is very brief compared to the frame time has little impact on CCD performance and trapping that is very long compared to frame time has an effect on the first frames, but does not last beyond that until the charge is detrapped. Only trapping that persists for a period of time comparable to the frame time effectively degrades CCD performance in each frame. For the range of frame times of greatest interest for current applications, the short trapping times for holes by divacancies will cause much less degradation in CCD performance than the more frame time coincident trapping times for electrons by E-centers. The result is that displacement damage in P-CCDs will be much less effective in degrading the performance of imagers than it would be in N-CCDs. For this reason, the instant invention uses the P-CCD rather than the N-CCD.

The second advantage in radiation hardness accruing from the use of P-CCDs arises due to the fact that the defect that dominates the degradation caused by displacement damage in this type of device is the divacancy. Divacancy formation is a second-order process, that is it requires that two vacancies interact whereas the formation of other defects, such as the E-center, require that one vacancy and one phosphorous atom interact. If the number of free vacancies available to form divacancies can be reduced by encouraging those originally produced by radiation to participate in other reactions, such as the formation of E-centers, then the concentration of divacancies produced by a given amount of radiation will be reduced and the degradation of P-CCD electrical parameters will similarly be reduced. The present invention accomplishes this by building a P-CCD in which E-center formation is encouraged, relative to divacancy formation.

To encourage the formation of E-centers at the expense of divacancies, consider that a region of the silicon in which the potential minimum exists and in which the minority carrier charge packets move is called a channel. The channel is formed by implanting a concentration $N_A$ of atoms of an element from column III of the Periodic Table of the Elements, such as boron. The boron atoms are also called a P type dopant or acceptors. The boron atoms are implanted into silicon previously doped with a concentration $N_D$ of atoms of an element from column V of the Periodic Table of the Elements, such as phosphorous. The phosphorous atoms are also called an N type dopant or donors. If the concentration of the P-type dopant introduced into the channel region exceeds that of the background N-type dopant therein, the electrostatic potential is a minimum and optically-generated holes will gather there. The location of the potential minimum in this region and the amount of optically generated charge this minimum can accommodate is determined by the net dopant atom concentration in the region, that is by the difference between the concentration of P-type dopant atoms or acceptors which are implanted and that of the N-type dopant atoms or donors originally there, i.e. $N_A$–$N_D$. The magnitude of $N_D$ in prior art devices is allowed to be low in order to satisfy other device requirements, so that it is not difficult to achieve any value of $N_A$–$N_D$ desired merely by controlling $N_A$.

In the present invention, however, an additional implant step is introduced, adding more donor atoms in the channel than are found in the remainder of the device. To compensate for this increase in donor atoms, acceptor atoms are added to maintain the same differential $N_A$–$N_D$ between acceptor and donor atoms. When nuclear radiation generates vacancies, the vacancies have the opportunity to interact with the higher background concentration of phosphorous atoms and will therefore produce more E-centers and fewer divacancies. But E-centers only trap electrons. Since the signal carriers in P-CCDs are holes the E-centers are harmless and the smaller concentration of divacancies formed mean that less degradation to P-CCD characteristics occurs.

Accordingly, a device according to the present invention is a nuclear radiation induced displacement and ionization damage resistant doped P-type buried channel charge-coupled device (P-BCD) for receiving an optical signal energy and thereafter converting the optical signal energy into an electrical signal charge. The device comprises an N-type silicon substrate supporting a plurality of layers comprising the device including a buried channel which collects electrical signal charges and a first channel stop region isolating the buried channel. A plurality of polysilicon gate layers supported by the substrate control the electrical charge and transfer the electrical charge to a plurality of external devices. A plurality of isolating silicon dioxide layers each electrically isolates adjacent polysilicon gate layers and adjacent doped silicon dioxide layers and provides for covering an outer surface of an outermost polysilicon gate layer. A source and drain region controls charge movement to and from the device which further comprises a second channel stop for isolating the device from adjacent devices and an outer covering overlays an outer exposed front surface of the polysilicon gate layers, protecting the gate layer outer exposed surfaces. Additionally, a plurality of conductive contacts each interconnect a selected device layer with a circuit and a voltage of one or more of the plurality of external devices. A doped silicon dioxide transfer layer covers a back surface of the N-type silicon substrate, accepting and transferring the optical energy to the buried channel through the substrate. Front surface illuminated devices are also possible but shadowing by polysilicon or aluminum layers in this configuration can pose a problem. A concentration of a plurality of dopant atoms in the buried channel increase the resistance of the BCD to ionization and displacement damage.

Further, according to the present invention, such a BCD is formed by a method comprising a series of steps. The steps begin with cleaning an N-type silicon wafer and thereafter growing a field silicon dioxide (field oxide) layer on a front side of the N-type silicon wafer. This oxide is removed selectively by etching. A first thin silicon dioxide layer is then overlayed on the wafer substrate. Next, according to the method, a plurality of an acceptor atom is implanted selectively in the front side of the wafer thereby forming a buried channel region which is then implanted with a plurality of a donor atom in the wafer thereby forming a vacancy getter in the buried channel region. The implanting of a plurality of the donor atom in the wafer also forms a first channel stop in the buried channel. A second thin silicon dioxide isolating layer is overlayed on the wafer followed by deposition of a nitride followed by deposition of a polysilicon gate 1. Thereafter, an optional buried channel supplementary implantation and growth of a third thin silicon dioxide isolating layer is followed by deposition of a polysilicon gate 2. A fourth thin silicon dioxide isolating layer is grown as an overlayment, followed by depositing a polysilicon gate 3. A fifth thin silicon dioxide isolating layer overlayment is then grown on the device. In selected areas source and drain regions of controlled devices are formed, followed by implanting a second channel stop and growing a sixth silicon dioxide isolating layer, and depositing a protective outer layer. If a back surface illuminated device is intended, to facilitate transfer of optical energy into the device substrate, a seventh thin silicon dioxide layer is applied to the back surface of the device followed by the implantation of a dopant into the back surface of the wafer. For a front illuminated device this step will not be necessary. Conductive contacts for interconnecting the device to external circuits are deposited into vias providing access to exposed surfaces of the device. The device is thereafter sealed and separated from the wafer.

DESCRIPTION OF A PREFERRED EMBODIMENT

Figure 1:
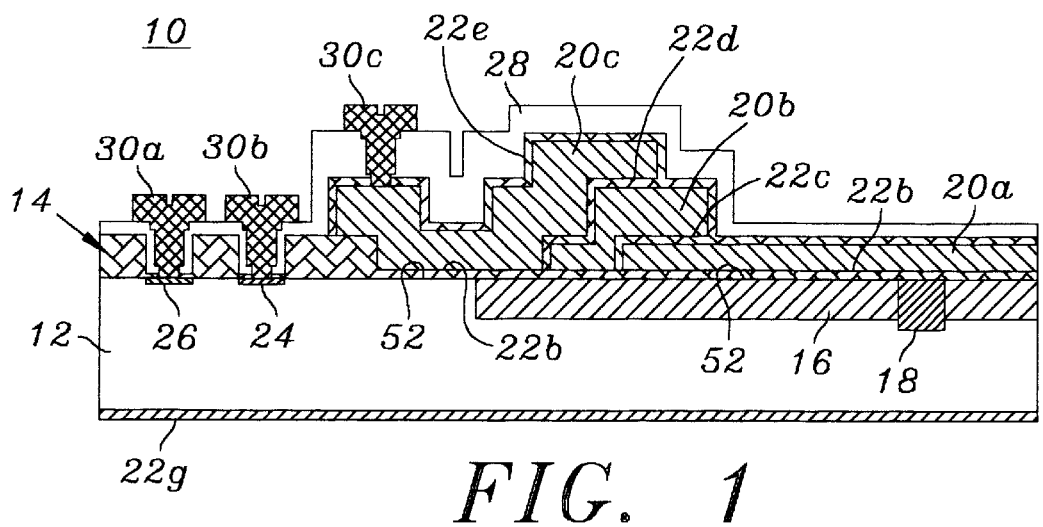
FIG. 1 is a partial section view of a wafer showing a lateral section view of a single device produced by the method of the present inventions.

The present invention as shown in FIG. 1, comprises a P-type buried channel charge-coupled device (P-BCD) 10 for receiving and converting an optical energy signal into an electrical signal charge. As a result of a plurality of dopant implants and process modifications, the device 10 exhibits an increased resistance to damage and degraded performance from exposure to nuclear radiation. A method for producing the device applies specific levels of dopants and minimum effective process temperatures to optimize the nuclear radiation resistance.

DEVICE

As shown in FIG. 1, the device 10 comprises an N-type silicon substrate 12 supporting a plurality of elements of the device; namely a field oxide layer 14, a buried channel region 16 for collecting charges generated by converting the optical energy signal into the electrical signal charge, a first channel stop region 18 for segmenting the buried channel region, a plurality of polysilicon gate layers 20 for controlling the electrical signal charge and for transferring the electrical signal charge to a plurality of external devices, a plurality of thin isolating silicon dioxide layers 22 each for electrically isolating otherwise adjacent elements of the device, source and drain regions 24, a second channel stop region 26, an outer layer 28 covering a front surface of the device for protecting the front surface of the device 10, a plurality of conductive contacts 30 each for interconnecting a selected device element with a circuit and a voltage of one or more of the plurality of external devices, and a thin silicon dioxide layer $22g$ on a back surface of the N-type substrate 12 for accepting and transferring the optical energy to the buried channel 16 on devices accepting back surface illumination, and dopant improvements for rendering the device nuclear radiation induced displacement and ionization damage resistant.

The improved device embodies a plurality of uniquely quantified dopants implanted in the substrate 12 forming the buried channel region 16 and the first channel stop region 18.

To best characterize the present invention, the operation of an unhardened N-CCD is first considered. By way of example, suppose a plurality of a signal charge packet of magnitude $Q_s = q\, n_e\, V_s$, separated by $N_z$ empty packets, are being shifted in a three-phase buried channel CCD at a clock period $T_o$, where q is an electronic charge, $n_e$ is a density of charges in the packet, and $V_s$ is a volume occupied by the packet. (A clock overlap of one-third is assumed, i.e.: $T_1 = T_2 = T_3 = T_o/3$.) If a plurality of a crystalline defect exists in a region of a potential well, they may trap some of a plurality of a carrier, releasing them at a later time. During $T_1$, free electrons are stored in the well under a first electrode, filling all of a plurality of a trap in that particular well. During $T_2$, most of the free electrons in the packet are transferred to a second electrode in accordance with a free-charge-transfer model. If the clock frequency is low, one can assume that all the free electrons in the charge packet are transferred to the second electrode in a very short time at the beginning of $T_2$. During the remainder of $T_2$, a plurality of the bulk trap emit electrons, which are also transferred to the second electrode, joining the charge packet.

The capture and emission of electrons by the bulk states can be described as follows. Let $N_t$ be a number of traps per unit volume located in a forbidden band at an energy level $E_t$ from a conduction band edge and $\sigma_n$ the capture cross section of the trap. The number $n_t$ of electrons trapped at the level will change with time according to Equation 1 where $n_e$ is the number of signal electrons in a conduction band and $V_{th}$ is a thermal velocity of electrons ($\approx$1E7 cm/sec for silicon at 300° K).

$$dn_t/dt = \sigma_n v_{th} n_e (N_t - n_t) - s_n v_{th} n_t N_c e^{-E/kT} \qquad \text{Eqn. (1)}$$

The first term in Equation 1 represents an electron trapping process, while the second term represents an electron emission process. Let $\tau_t$ and $\tau_e$ be the time constants representing a rate of electron trapping and emission processes, respectively:

$$\tau_t = 1/\sigma_n v_{th} n_e, \text{ and } \tau_e = e^{-E/kT}/\tau_n v_{th} N_c \qquad \text{Eqns. (2) and (3)}$$

Then since $\sigma_n \approx$ 4E-15 cm$^2$, $N_c$ = 3E19/cm$^3$ for the levels of interest in silicon at room temperature, and $n_e \approx$ 1E14 or higher, one finds $$\tau_t = 0.1 \text{ usec and } \tau_e = 0.3 \text{ msec.}$$

Equation 1 can be rewritten in terms of these time constants as:

$$dn_t/dt = (N_t - n_t)/\tau_t - n_t/\tau_e \qquad \text{Eqn. (4)}$$

When a charge packet arrives at a potential well, some of the signal electrons will be captured by the traps, establishing a steady state within a time of the order of $\tau_t$. Then, the amount of charge due to signal electrons trapped in these states is:

$$q_{t=vs}q\, n_t dV, \qquad \text{Eqn. (5)}$$

where $V_s$ is a volume the signal electrons occupy in the well. From Eqn. 4, $n_t$ in the steady state is given by:

$$n_t = N_t/((1+\tau_t)/\tau_e) \qquad \text{Eqn. (6)}$$

Therefore, $$q_t = {}_{vs}(qN_t/(1+(N_c/n_e)e^{-E/kT})dV, \qquad \text{Eqn. (7)}$$

When the signal electron charge $q_t$ is transferred to the second electrode, the charge concentration under the first electrode decreases rapidly and the trapping time constant increases to a very large value. Then, electron emission dominates, and $dn_t/dt$ becomes:

$$dn_t/dt = -n_t/\tau_e \qquad \text{Eqn. (8)}$$

Therefore, the number of electrons trapped in the radiation-induced traps decreases exponentially with time during the time that emission is taking place.

As stated above, if the clock frequency is low, one can assume that all the packet electrons are transferred to the second electrode in a very short time at the beginning of $T_2$. During the remaining portion of $T_2$, bulk traps emit electrons, which are also transferred to the second electrode, joining the first charge packet. The number of electrons emitted during this time period will be:

$$Q_e(T_2) = qN_t V_s[1-\exp(-T_2/\tau_e)] \qquad \text{Eqn. (9)}$$

During $T_3$ and the next $N_z$ time periods, the bulk traps continue to emit electrons. During $T_3$, emitted electrons can move forward or backward depending on the exact position of the bulk trap and the potential profile. Here we assume that all the electrons emitted during $T_3$ do not join the first charge packet. This assumption gives the worst case estimate of the transfer inefficiency. The total number of electrons emitted $Q_e$(total) before a second charge packet arrives is therefore given by:

$$Q_e(\text{total}) = qN_t V_s[1-\exp((-2T_o/3\tau_e)-N_z(T_o/\tau_e)] \qquad \text{Eqn. (10)}$$

When the second charge packet arrives, the traps are filled again, replacing electrons that escaped the traps during the interval between the two charge packets. The charge lost from the second charge packet is then $Q_e$. When this second packet is transferred to the next electrode, some trapped electrons are emitted and join the second charge packet in a process similar to that which occurred during $T_2$ when the first charge packet was transferred.

The trapped electrons emitted during $T_2$ (=$T_o/3$) will join the second charge packet, and represent a gain ($Q_{gain}$) of charge by the packet.

$$Q_{gain} = qN_t V_s[1-\exp(-T_o/3\tau_e)] \qquad \text{Eqn. (11)}$$

Thus, the net loss $\Delta Q$ for the second charge packet is given by:

$$\Delta Q = qN_t V_s \exp(-T_o/3\tau_e)[1-\exp(-2(T_o/3\tau_e)-(N_z T_o/t_e)] \qquad \text{Eqn. (12)}$$

Figure 2:
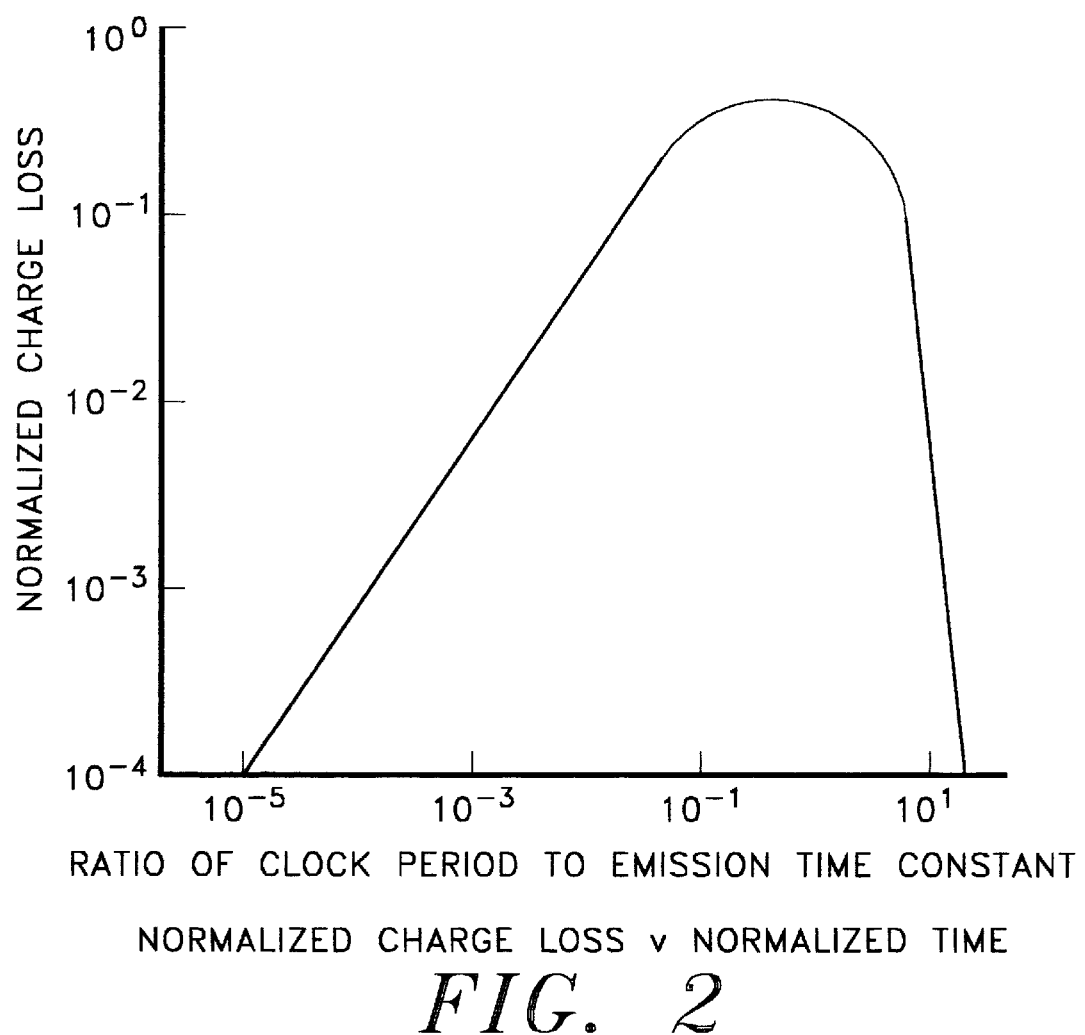
FIG. 2 shows a plot of the charge lost by a specific charge packet in a CCD, normalized to the maximum amount of charge lost, vs. the ratio of clock period to emission time constant (the frame time divided by the trap re-emission time), for a charge packet with ten empty pixels between each full pixel.

FIG. 2 shows a plot of $\Delta Q$ (normalized) vs. the ratio of $T_o/\tau_e$ for $N_z=10$. For large values of $T_o/\tau_e$, most of the trapped electrons are emitted during $T_o/3$, and join the main charge packet. For small values of $T_o/\tau_e$, the trapped electrons do not have enough time to be emitted during $T_o/3$, so the traps stay filled and are ineffective in trapping additional carriers. Both cases result in a low charge loss. For an intermediate case, $\Delta Q$ has a maximum, given by:

$$\Delta Q_{max} = qN_t V_s \exp(-3T_o/\tau_e) \qquad \text{Eqn. (13)}$$

The transfer inefficiency (CTI) is simply the ratio of $\Delta Q$ to $Q_s$.

$CTI=(N_t/n_e)\eta$ and $$\eta = \exp(-3T_o/\tau_e)[1-\exp(-2(T_o/3\tau_e)-(N_z T_o/\tau_e)] \qquad \text{Eqn. (14)}$$

Since $n_e$ is not a design variable which can be used to improve CTI, there are only two terms at the disposal of the designer, that is trap density, $N_t$, and the trap effectiveness factor, $\eta$.

Hardening P-CCDs may be accomplished by reducing the trap effectiveness factor $\eta$. P-CCDs are more radiation-resistant than N-CCDs because of the reduced effectiveness of divacancies compared to E-centers, which are the dominant radiation-induced defect in N-CCDs. Traps are more or less effective, depending upon whether carriers are re-emitted from them more quickly or more slowly than the clock period $T_o$. Shallow traps, that is traps with lower energy levels, do not hold trapped carriers for long, and therefore are not as effective as deep traps, those with high energy levels. However, if traps are too deep, they retain carriers for a long time, and while they are occupied, they cannot trap additional carriers, and are essentially disabled. Thus, trap emission times determine trap effectiveness.

Eqn. 14 shows that CTI is a function of clock period and trap emission time constant $\tau_e$. Trap emission time constant $\tau_e$, in turn, is determined by an energy level, capture cross section of the trap and temperature. If the trap is shallow, and/or if the temperature is high, emission is very probable, and the trap can be considered unoccupied. If the trap is deep, and/or if the temperature is low, emission is very unlikely. To determine the effectiveness in degrading CTI of traps introduced by displacement damage, it is necessary to evaluate Eqn. 14 for different traps and different temperatures. Numerous investigators have measured the levels of radiation-induced traps. Table 1 below from "Defect States in Electron-bombarded Silicon: Capacitance Transient Analysis", by L. C. Kimerling in Radiation Effects in Semiconductors, International Physics Conference Series (Great Britain), No. 31 (London 1977) shows these traps, their initial/final charge state, energy level in millivolts and capture cross section in cm$^2$.

TABLE 1

RADIATION INDUCED DEEP LEVELS IN SILICON

| Trap | Initial/Final Charge State | Energy Level | Cross Section (cm$^2$) |
|---|---|---|---|
| P-V E center | –/0 | $E_c$ – 456 meV | 3.7E-15 |
| Divacancy | –/0 | $E_c$ – 390 meV | 4E-15 |
| Divacancy | +/0 | $E_v$ + 210 meV | 2E-16 |

Figure 3:
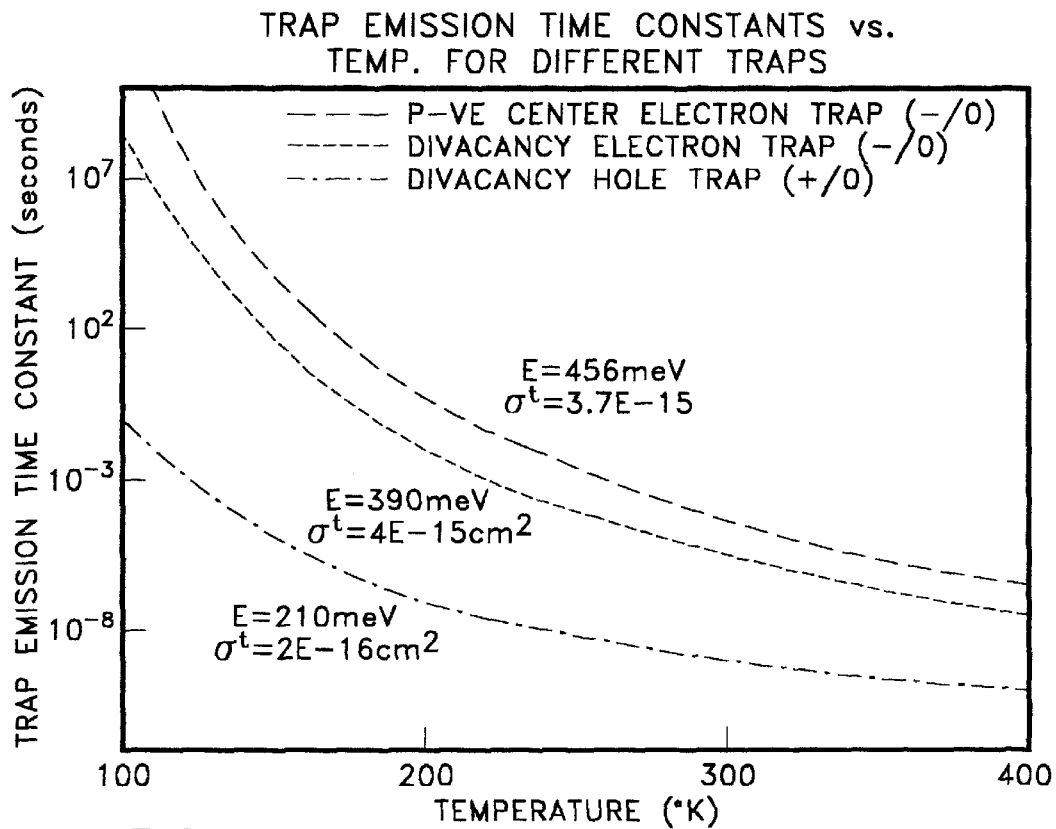
FIG. 3 shows trap emission time constant vs. temperature for the phosphorous-vacancy E-center electron trap, the divacancy electron trap, and the divacancy hole trap, showing the differences in the times during which the traps trap carriers.

FIG. 3 shows trap emission time constant vs. temperature for a phosphorous-vacancy (P-V) E-center electron trap, the divacancy electron trap, and the divacancy hole trap. The P-V E-center has been identified as the primary culprit in the degradation of CTE of CCDs due to displacement damage.

The divacancy electron trap may also play a role in the damage of N-CCDs, since its energy is so close to that of the E-center that it would be difficult to resolve them.

Figure 4:
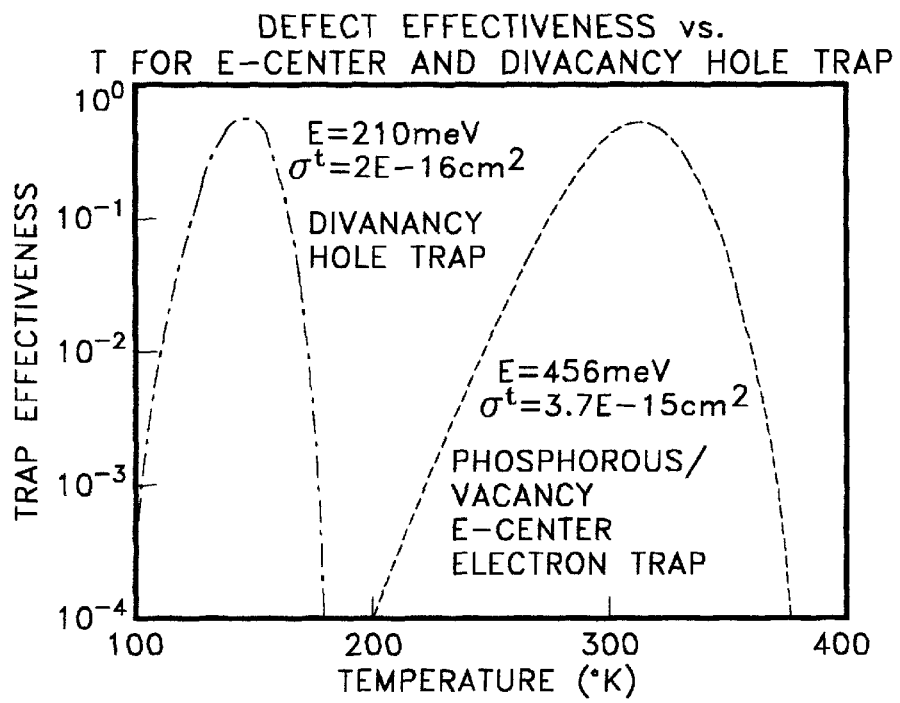
FIG. 4 shows the normalized charge transfer inefficiency, CTI, vs. temperature for the E-center and the divacancy hole trap depicting the E-center (which traps electrons) optimum effectiveness at and near room temperature and the divacancy hole trap optimum effectiveness at low temperatures.

FIG. 4 shows the normalized CTI vs. temperature for two of the traps discussed above. The P-V E-center electron trap, the dominant trap in N-BCDs, is seen to be most effective near room temperature, and CTI can be improved by operating the devices at reduced temperatures. As described in "Nuclear Instruments and Methods in Physics Research", by A. D. Holland, A26, (1993), Pages 335 to 343, this, in fact, is currently done. However, FIG. 4 also shows that if P buried channel devices were used, in which the divacancy hole trap dominated, these traps would not be effective in increasing CTI unless the temperature was below 180° K. Thus, P-CCDs will be more resistant to displacement damage than N-CCDs. Furthermore, P-BCDs will not degrade performance, even though the mobility of holes is less than electrons, since carrier mobility is relatively unimportant for most CCD imagers operating at conventional frame rates. Consequently, the present invention provides a high performance CCD imager that is more tolerant to displacement damage than others by using the reduced trap effectiveness factor which is seen in P-CCDs. Further, the present invention combines the technology proposed by Saks, et al, supra, with the techniques for fabricating a three phase CCD using P buried channel technology to produce a process for fabricating a P-BCD which is tolerant to both total ionizing dose and to displacement damage. A method according to the present invention for fabricating a three-phase CCD is presented hereinafter under the heading "METHOD OF PRODUCTION".

In the present invention it is expected that divacancies will form with lower densities than E-centers due to the second order nature of the process in which they form, and since divacancies are the only defect that can trap holes in P-BCDs, P-BCDs should be harder than N-BCDs due to lower trap densities for a given radiation dose. Also, divacancy production can be reduced still further by 'gettering' vacancies with phosphorous, thus suppressing the formation of divacancies. This is in addition to that achieved as a result of the reduced trap effectiveness in P-CCDs.

More particularly, the stable defects produced by radiation all involve a vacancy. The dominant defect in N-BCDs (the only CCD imager produced today) is the E-center, that is the combination of a vacancy and a phosphorous atom. In P-BCDs, the dominant defect is the divacancy, since the signal carrier in P-BCDs is holes, and only the divacancy traps holes. Also, the production of stable defects changes from a first order to a second order process in P-BCDs. The production of damage in P-BCDs will be further minimized by "gettering" free vacancies. In the gettering process, the formation of E-centers is encouraged, to the extent that this can be done without affecting electrical parameters. The present invention achieves gettering by varying the impurity compensation level in a device. In this regard, I. Tsevybak, et al, in the IEEE Transactions on Nuclear Science, Volume 39, Number 6, Pages 1720 to 1729 have shown that if the difference between the number of acceptor atoms $N_A$ and the number of donor atoms $N_D$ is maintained constant while $N_D$ is allowed to increase, the electrical properties of a sample remain constant, but the initial response to displacement damage is significantly improved. In the present invention, this technique is applied to CCDs by using excessive doping compared to prior art in the channel implant process, as follows. An additional phosphorous or donor implant is introduced to increase the background phosphorous level, while the boron or acceptor implant is increased to offset the higher phosphorous level, maintaining the same $N_A-N_D$. With the higher level of phosphorous in the channel, free vacancies are better able to react with phosphorous atoms to produce E-centers than they would without the over-doping, and fewer vacancies are available to produce divacancies. This results in a P-BCD resistant to total ionizing dose and to displacement damage.

Thus, as shown in FIG. 1, the device 10 of the present invention is a nuclear radiation induced displacement and ionization damage resistant doped P-type buried channel charge-coupled device (P-BCD) which receives optical signal energy in the vicinity of the buried channel region and therein converts the optical energy to an electrical signal.

In an imager formed from a plurality of the devices 10, an N-type silicon wafer comprises an array of a plurality of the device 10 shown in FIG. 1. Each device of the array is identically formed on the wafer as a light sensing element or pixel. Briefly, for each device 10, the field oxide layer 14 is grown on a front surface of the substrate 12 and within the substrate the buried channel 16 is formed by the introduction of uniquely quantified dopants, proportioned to optimize nuclear radiation tolerance. The first channel stop region 18 is then formed, segmenting the buried channel. The plurality of polysilicon gate layers 20 are added which control the electrical charge packets within the device and transfer the electrical charge packets to a plurality of external devices. The thin silicon dioxide layers 22 then are sequentially formed between the gate layers 20, each isolating adjacent polysilicon gate layers and the adjacent doped substrate 12. By the introduction of dopants, source and drain regions 24 are formed for controlling charge movement within the device 10. The array of devices formed on the wafer is arranged in rows and columns. Lateral separation of adjacent columns of devices provides isolation between the laterally positioned devices. The devices, equally spaced and longitudinally mutually adjacent in the columns are isolated by placement of the second channel stop 26 at an end of the device opposite from the first channel stop 18. To protect an outer surface of the front of the device, a protective layer 28 is deposited as an overlayment. Then the plurality of conductive contacts 30 are positioned to extend through the protective layer 28 each for interconnecting a selected element of the device 10 with a circuit and a voltage of one or more of the plurality of external devices.

Thus constructed, optical signal energy enters the device through a back surface. (Front surface optical signal energy entry operation is also possible, but is less efficient as a result of shadowing of the buried channel by the covering layers.) A thin silicon dioxide layer 22g is grown on the back surface of the N-type silicon substrate 12 intended for back illumination, accepting and transferring the optical energy through the substrate to the buried channel region 14.

More particularly, the N-type silicon device substrate 12 exhibits an essentially uniform concentration of a plurality of donor atoms, a crystalline structure orientation of 1-0-0 and a resistivity of about 5 to 10 ohm-cm.

Figure 5:
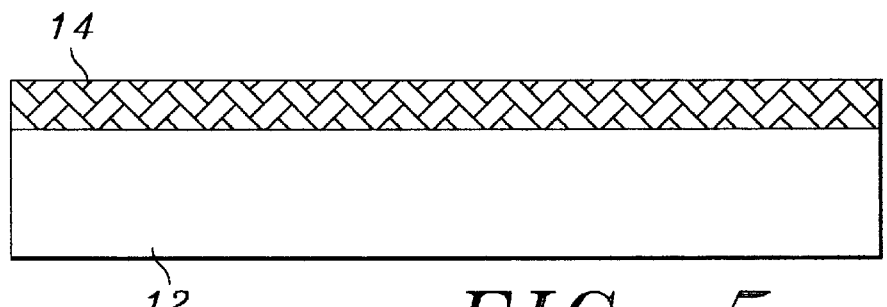
FIG. 5 is a partial lateral sectional view of a basic wafer substrate showing a single device with a field oxide layer applied.
Figure 7:
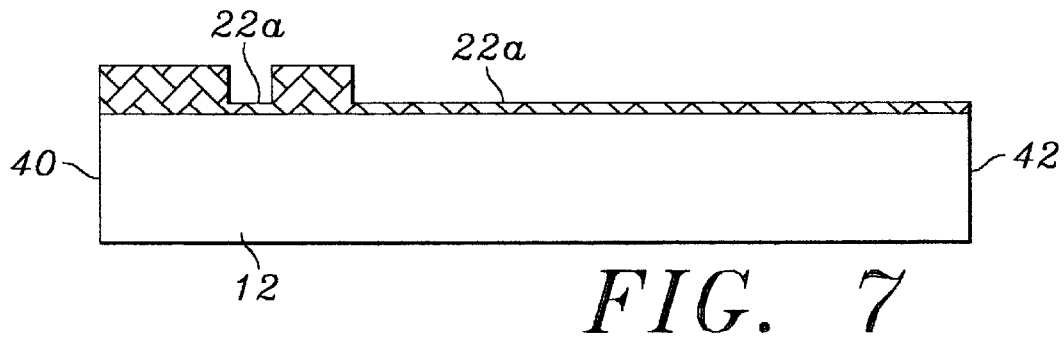
FIG. 7 shows a partial lateral sectional view of a basic wafer substrate showing the device of FIG. 6 with the field oxide segments removed and replaced by a first isolating oxide layer.

As shown in FIG. 5, a silicon dioxide field oxide layer 14 is applied as an initial growth on a front surface of the substrate 12. A first thin silicon dioxide layer 22a of about 150 Å thickness is then grown on an exposed front surface of the substrate 12 as shown in FIG. 7.

Figure 8:
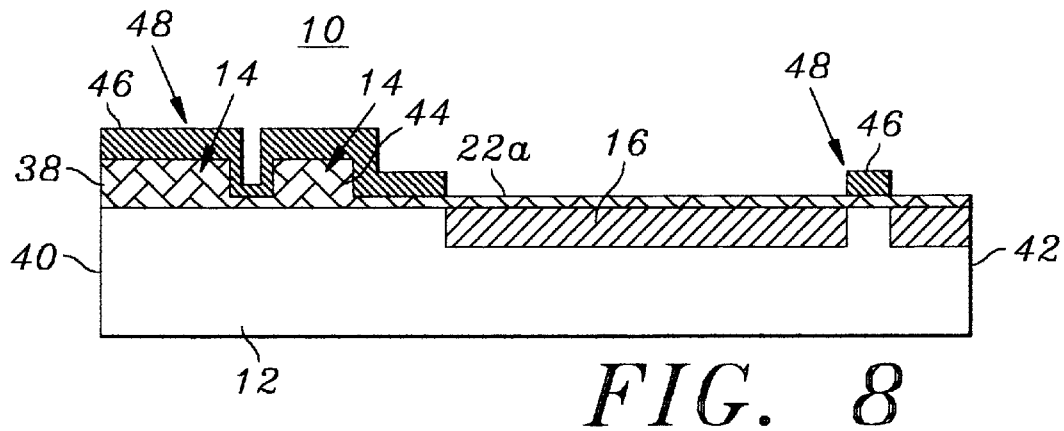
FIG. 8 shows a partial lateral sectional view of a basic wafer substrate showing the device of FIG. 7 with a photoresist buried channel mask forming an initial buried channel implantation.

Within the device 10, as shown in FIG. 8, the buried channel region 16 is formed, extending from the front surface of the device perpendicularly into the substrate 12 and longitudinally along the front surface of the device from an approximate midpoint to the second end 42. The buried channel 16 is formed by a distribution of a plurality of dopant atoms implanted in a volume defining the buried channel region. The buried channel dopant atoms comprise a plurality of an acceptor dopant atom and a plurality of a donor dopant atom.

Preferably, the acceptor atoms are boron, implanted using an implant energy level of about 60 KeV. The energy is applied to an implant concentration of boron atoms of about 6E12 per sq cm over an area in FIG. 8 defined by a Buried Channel Mask 46 of a photoresist material 48. The mask exposes a selected area of the front surface of the device 10 to the implant to form the buried channel region 16 but masks a remaining area of the front surface of the device. The dose level is selected to optimize nuclear radiation resistance.

Figure 9:
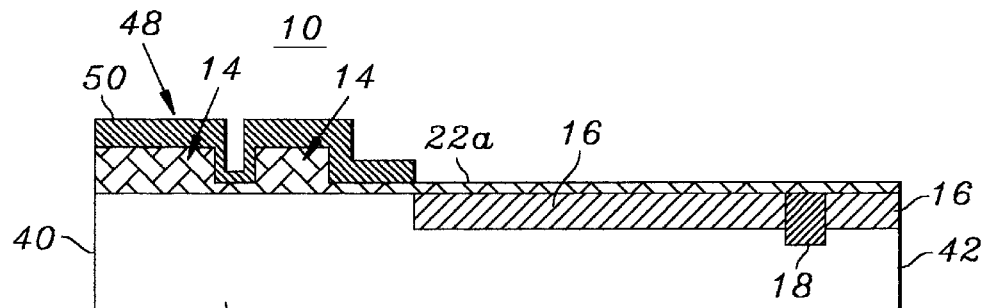
FIG. 9 shows a partial lateral sectional view of a basic wafer substrate showing the device of FIG. 8 with a photoresist buried channel and channel stop mask forming a combined buried channel and channel stop implantation.

Preferably, the donor atoms are phosphorous, a so-called getter implant, using an implant energy level of about 165 KeV applied to an implant concentration of phosphorous atoms of about 3E12 per sq cm over an area as shown in FIG. 9 defined by a mask. The mask exposes the buried channel region 16 and the channel stop region 18. As with the acceptor implant, the donor implant concentration is selected to optimize nuclear radiation resistance.

On the wafer surface, each device mask is on the order of one micrometer (10,000 Å) in thickness and is formed by the photoresist 48 such as Kodak Thin Film Resist (KTFR), Kodak 747 Resist by Eastman Kodak Company of Rochester New York or Shipley 1350 by Shipley Company, Inc. of Newton, Mass. Each photoresist has unique characteristics and the use of each is somewhat a matter of personal preference. After the buried channel 16 and channel stop 18 implants are completed, the photoresist mask is removed.

The first channel stop region 18 is formed by implanting the region with phosphorous atoms using a mask during the buried channel 16 getter implant. Following the implanting of the buried channel 16 and first channel stop 18 regions, the implant is annealed and the first thin silicon dioxide layer 22a is stripped. A second thin silicon dioxide layer 22b of about 100 Å is grown and a deposit of about 1200 Å thickness of nitride 52 applied over the wafer.

Figure 10:
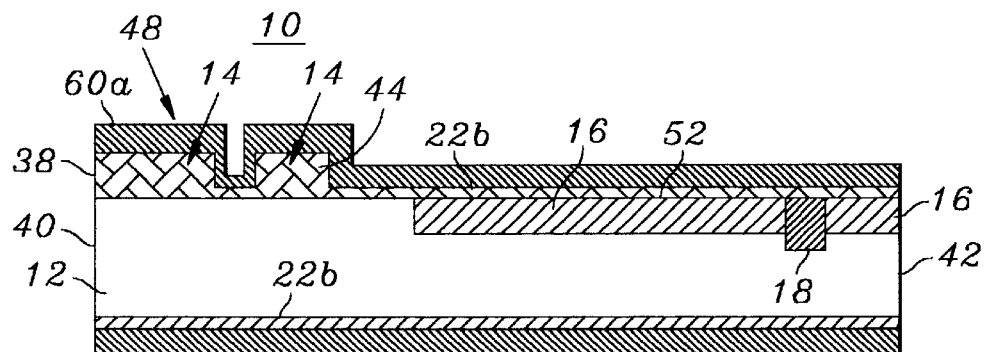
FIG. 10 shows a partial lateral sectional view of a basic wafer substrate showing the device of FIG. 9 with overall photoresist mask applied after formation of the buried channel region and the channel stop.
Figure 11:
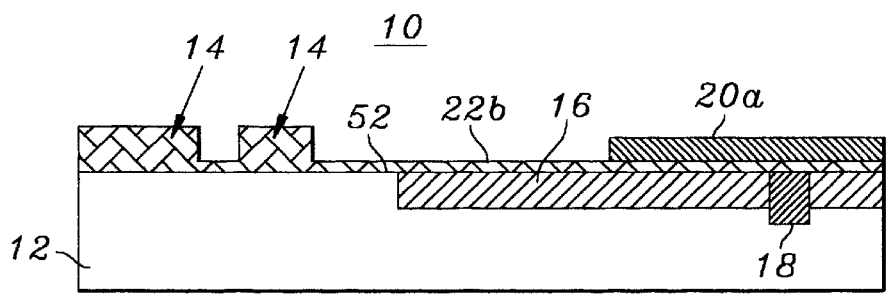
FIG. 11 shows a partial lateral sectional view of a basic wafer substrate showing the device of FIG. 10 with a first polysilicon gate applied.
Figure 12:
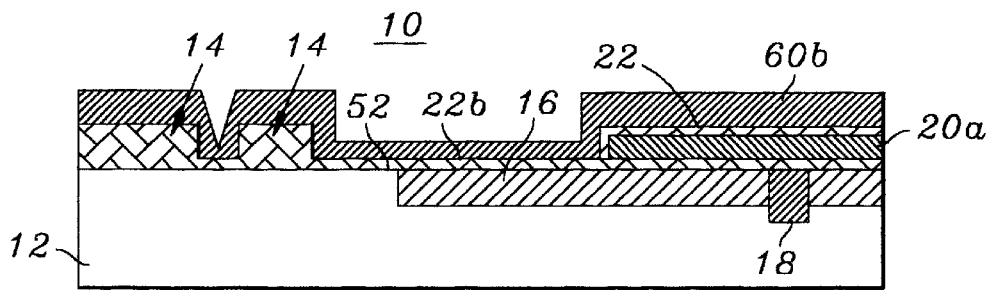
FIG. 12 shows a partial lateral sectional view of a basic wafer substrate showing the device of FIG. 11 with a second isolating silicon dioxide layer applied and overlayed with a second polysilicon gate layer.

As shown in FIG. 10, a first polysilicon layer 60a is then deposited on the device to a thickness of about 6500 Å. Using a photoresist mask, any unwanted polysilicon is removed from the back surface of the device with a conventional plasma etch. Similarly, the nitride layer 52 and the second thin silicon dioxide layer 22b are removed from the back surface of the device by plasma etch. A polysilicon gate #1, 20a, is formed using a photoresist Gate #1 mask. The gate #1, 20a, thus formed covers about two thirds of the surface area of the buried channel region 16 adjacent to and including the first channel stop region 18, as shown in FIG. 11. The polysilicon gate #1 formation is followed with a diffusion of POCl$_3$. An overlaying third thin silicon dioxide isolating layer 22c of about 600 Å thick is then applied and annealed to prevent gas interaction with the silicon.

Similarly, as shown in FIGS. 12, 13, 14 and 15, a second and a third polysilicon gate 20b and 20c are formed on the front surface of the device, each covering an equal length sequentially adjacent portion of the surface of the buried channel region 16 and partially overlapping the previously applied polysilicon gate. Following formation of the second and third gates 20b and 20c, an overlayment of a fourth and fifth thin silicon dioxide isolating layer 22d and 22e respectively of about 600 Å thickness is applied, each separating the adjacent gates.

The source and drain regions 24 are formed between the two field oxide segments 38 and 44 by using a Source/Drain Mask and implanting a concentration of about 5E15 boron dopant atoms per sq cm in the substrate at an energy level of about 60 KeV.

Figure 15:
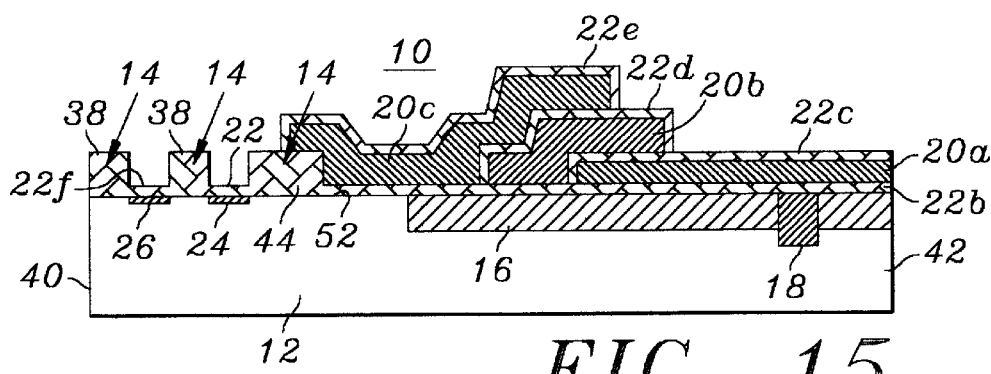
FIG. 15 shows a partial lateral sectional view of a basic wafer substrate showing the device of FIG. 14 with a third polysilicon gate formed and overlayed with a fourth thin silicon dioxide isolating layer applied.

A second channel stop 26 is implanted by removing a center section of the field oxide segment 38 using a Channel Stop Mask and buffered HF and thereafter implanting a dose of about 5E15/sq cm of arsenic using an implant energy level of about 140 KeV followed by an implant dose of phosphorous of about 5E13/sq cm at about 120 KeV. After stripping the photoresist, the wafer is annealed in nitrogen at about 900° C. and a sixth thin silicon dioxide layer 22f of about 300 Å thickness is grown over the second channel stop 26 as shown in FIG. 15.

Figure 16:
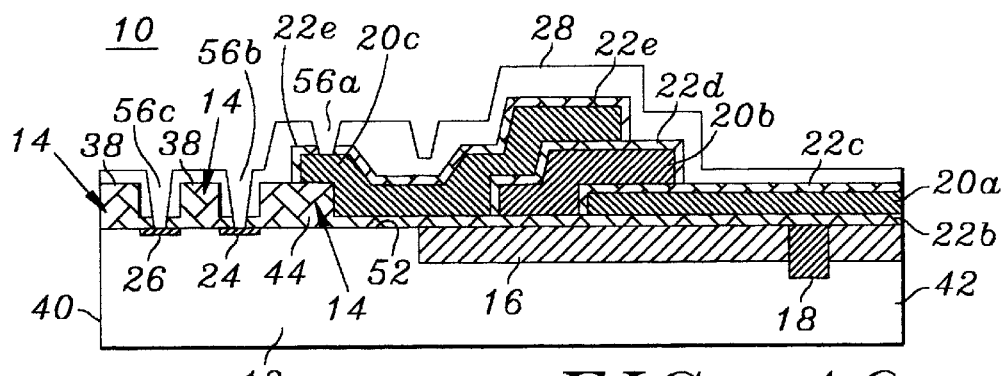
FIG. 16 shows a partial lateral sectional view of a basic wafer substrate showing the device of FIG. 15 with a protective layer applied and vias opened to contact areas on the device.

The protective layer 28, a passivating coating such as borophosphosilicate glass (BPSG) shown in FIG. 16, is initially deposited to a thickness of about 10,000 Å on the front surface of the device and flowed to form a conformal coating at a temperature of about 900° C. After the protective layer is applied, three contact vias 56 are exposed using a Contact Mask with a plasma etch applied to the protective coating 28. A first via 56a exposes a contact area on the third polysilicon gate 20c, a second via 56b exposes a contact area on the source/drain 24 and a third via 56c exposes a contact area on the second channel stop 26.

To enhance acceptance of the optical energy by the silicon substrate 12 and efficient transfer to the buried channel 16 in the back illuminated option, a seventh thin silicon dioxide layer 22g, about 100 Å thick, is grown on the back surface of the device as shown in FIG. 1. Thereafter, about 2.5E14 arsenic atoms per sq cm are implanted into the back surface of the device at an energy level of about 10 KeV and annealed. The arsenic implantation is optional and enhances the response of the device to ultraviolet radiation.

As shown in FIG. 1, conductive contacts 30 are sputter deposited aluminum containing about 1% silicon. The contact metallization is deposited into each via 56 shown in FIG. 16, to a thickness of about 12,000 Å and sintered at a temperature of about 450° C. The metal contacts 30a, 30b and 30c thereby form a low resistance connection, as shown in FIG. 1, with the second channel stop region 26, the source/drain region 24 and the third polysilicon gate 20c, respectively. A chemical etch of the aluminum contacts 30 forms clean surfaces for later low resistance welded connections to external circuits.

METHOD OF PRODUCTION

The method of the present invention as briefly and generally described above, modifies a prior art method for producing the P-type buried channel charge-coupled device (P-BCD) for receiving and converting an optical energy signal into an electrical signal charge while achieving an improved resistance to displacement and ionization damage from nuclear radiation.

For a preferred method of the present invention, an N-type silicon wafer 12 with a 1-0-0 crystal orientation and specific resistivity between 5 and 10 ohm-cm is used.

The first step in the method cleans the wafer in preparation for the formation of the device 10. Wafer cleaning provides for the removal of impurities from the silicon surface to prevent the diffusion of unwanted impurities into the silicon during the heating associated with the diffusion process.

A wafer of an N-type silicon of 1-0-0 crystal orientation and 5 to 10 ohm-cm resistivity, in a condition from the above pre-preparation, is subjected to an initial cleaning by immersion in deionized water using ultrasonic agitation. Thereafter, the wafer is processed in a Standard Clean #1, followed by process in a Standard Clean #2. Standard Clean #1 comprises a soak for about 20 minutes in a solution of $NH_4OH:H_2O_2:H_2O$ (about 5:1:1) at a temperature of about 80° C. Similarly, Standard Clean #2 comprises a soak for about 20 minutes in a solution of $HCl:H_2O_2:H_2O$ (about 6:1:1) at a temperature of about 80° C.

Following the wafer cleaning, each wafer is similarly processed to simultaneously form many P-BCDs. The method herein describes a single device as a part of the wafer. As a first step, as shown in FIG. 5, a silicon dioxide layer is grown on a front surface of the device to form a field oxide layer 14. The wafer is placed in a pressure vessel with temperature controlled therein at about 950° C. Oxygen is introduced through a container of deionized water maintained at about 90° C. into the pressure vessel. The presence of wet oxygen at the elevated temperature causes the surface of the P-type silicon device to oxidize, growing a silicon dioxide layer of about 7000 Å thick.

A photoresist coating is then applied to a front surface of the wafer using about 30 cycles per second (cps) or about 1800 revolutions per minute.

The photoresist coating may be a negative or positive solution. Negative photoresist solutions are typified by Kodak Thin Film Resist (KTFR) and Kodak 747 Resist (Eastman Kodak Company, Rochester N.Y.) or Hunt Waycoat (Shipley Company, Newton Mass.). A typical positive photoresist is Shipley's 1350 series. Each type has unique characteristics and the application is considered largely a matter of personal preference. In this preferred method, a positive photoresist is used, i.e.: a mask defines the photoresist to be removed from the wafer.

Applying the photoresist comprises mounting the wafer with a back surface of the wafer held in intimate contact with a horizontally oriented planar rotational surface with a center of the wafer coincident with a vertical axis of rotation. Two drops of photoresist with a viscosity of approximately 35 centipoise are applied to a central point on a front surface of the wafer. The rotational surface and wafer are then spun at a predetermined rotational speed of between about 1,800 to 10,000 revolutions per minute (rpm) (typically about 30 to 70 revolutions per second) for about 20 seconds. Centrifugal force thereby distributes a photoresist coating on the wafer surface of about 10,000 Å in thickness. The wafer is removed from the rotational surface and baked at about 120° C. for about 15 minutes to expel residual volatile solvents. Viscosity, spin speed and coating thickness are optimized for the process step involved. Following the coating and baking, a mask image appropriate to the step may be focused by lenses (Canon FPA-121 Projection Alignment System) onto the wafer, thereby precisely positioning the mask image on the wafer and exposing the photoresist to collimated ultraviolet (UV) light (about 4360 Å or 4050 Å) for typically about 1 minute. The exposure to UV polymerizes the photoresist, making the exposed areas resistant to certain acids in an industry standard manner[a]. For the field oxide pattern formation, a Field Oxide Mask is used. After the exposure of the photoresist, the wafer is immersed in a developer of an aqueous solution to dissolve the exposed photoresist, followed by a baking at about 140° C. for about 15 minutes.

Figure 6:
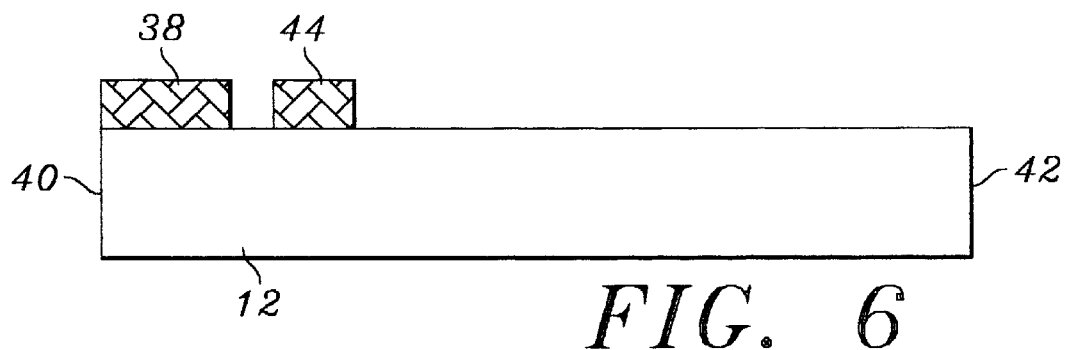
FIG. 6 shows a partial lateral sectional view of a basic wafer substrate showing the device of FIG. 5 with field oxide segments removed by selective etching.

The wafer is immersed in a buffered HF solution for approximately 7 minutes at room temperature to etch a Field Oxide layer pattern on the front surface of the wafer and to remove the silicon dioxide layer on a back surface of the wafer, as shown in FIG. 6. The buffered HF solution comprises hydrofluoric acid, ammonium fluoride and deionized water (1:1:10)

When the etching is completed, the photoresist is removed by applying an oxygen plasma to the photoresist, and thereafter immersing the wafer in a sulfuric acid bath. The oxygen plasma is applied by placing the wafer in the pressure vessel and evacuating the vessel to about 0.2 Torr. Oxygen in then bled into the vessel at a rate of several hundred cc per minute. RF energy at about 13.56 MHz is inductively coupled to the oxygen in the vessel, activating the oxygen. The oxygen combines with the photoresist polymer to form carbon monoxide, carbon dioxide and water. Following the plasma etch, any photoresist residue is stripped by immersing the wafer in the acid bath at room temperature for approximately five minutes.

The wafer is cleaned using Standard Clean #1 and Standard Clean #2. A first thin silicon dioxide layer 22a is then grown on the wafer, as shown in FIG. 7, to a thickness of about 150 Å at about 800° C. in the pressure vessel using the wet oxygen process previously described.

As a precursor to forming the buried channel 16, the photoresist 48 layer is again centrifugally applied to the front surface of the wafer using about 30 cps in the manner previously described. Exposure of the photoresist to the UV radiation using an Isolated Implant Mask, developing the photoresist by immersion in an aqueous alkaline solution and baking the wafer at about 140° C. for 10 to 20 minutes as previously described, prepares the wafer front surface for the acceptor (boron) implant. Boron atoms are implanted in the exposed surface of the device to form a buried channel region 16 using a dose of about 6E12 atoms per sq cm at an energy level of about 60 KeV. This dose is greater than in prior art methods and is introduced in anticipation of the introduction of a similarly greater dose of a donor implant. The difference between the excess of these implants is one basis for the reduced radiation susceptibility as discussed earlier.

Implantation is achieved by passing a gaseous species of the implant through an electronic discharge under the control of a magnetic field to form ions and extract the ions into an accelerator column from which the ions are directed to the surface of the wafer in the vessel. The depth of penetration of the ions is dependent on the size of the ion and the implantation energy and is well known to practitioners of the art. Following the implantation, the wafer is heated in the vessel to anneal the device, healing any implant damage and more uniformly distributing the implant in the wafer substrate 12. The photoresist is then stripped using the oxygen plasma and acid bath as previously described.

A new photoresist layer is applied to the front surface of the wafer using 30 cps rotational speed as previously described. Additionally, the photoresist is exposed and baked as before using a mask, and subsequently developed and baked to define the implant area as shown in FIG. 9. The phosphorous (donor) implant in the boron rich buried channel region 16 and formation of an internal channel stop region 18 of the wafer uses a dose of 3E12 phosphorous atoms per sq cm at an energy level of 165 KeV in the manner previously described. As previously, the photoresist is stripped using the oxygen plasma and the acid bath. The wafer is then cleaned using the Standard Clean #1 followed by the Standard Clean #2 and annealed in the pressure vessel for about 15 mins at about 1000° C. in a nitrogen atmosphere. Next, the first thin silicon dioxide layer 22a is stripped in a buffered HF solution as previously described.

The wafer is cleaned with Standard Clean #1 using ultrasonic agitation followed by Standard Clean #2. Thereafter, a second thin silicon dioxide layer 22b is grown to a thickness of about 100 Å as before, except dry oxygen is used, at about 560° C. On the wafer in the pressure vessel a nitride layer 52 is deposited to a thickness of about 1200

Å. The deposition occurs by reducing the pressure in the vessel and introducing silane ($SiH_4$) and ammonia ($NH_3$) (about 150:1) as a gaseous stream into the vessel with a wall temperature maintained at about 700° C.

Thereafter, with the wafer in an epitaxial reactor, a first polysilicon layer 60a is deposited to a thickness of about 6500 Å with reactor wall temperature at about 560° C. The reactor is evacuated and silane ($SiH_4$) is introduced, forming epitaxial silicon microcrystals (polysilicon) on the wafer as shown in FIG. 10. To remove the polysilicon, $Si_3N_4$ and $SiO_2$ layers from the back surface of the wafer, the photoresist layer is applied to the front surface of the wafer using about 30 cps as previously described and baked at about 140° C. without using a mask. The wafer is then plasma etched as described previously using $CF_4+O_2+CF_3Cl$, stripping the polysilicon 60a from the back surface. The nitride layer 52 is stripped from the back surface of the wafer by immersing the wafer in boiling phosphoric acid. Following the nitride removal, the second $SiO_2$ layer is stripped from the back surface of the wafer using $CHF_3+C_2F_6+He$ in the plasma etch procedure in an evacuated vessel as described supra. The photoresist is stripped using the oxygen plasma and acid method and the wafer cleaned with Standard Clean #1 using ultrasonic agitation.

Since the amount of phosphorous dopant to be introduced into the polysilicon in this step is not critical, diffusion is used as a less expensive doping method. To diffuse the phosphate chloride ($POCl_3$) as a dopant in the first polysilicon layer 60a of the wafer, the wafer vessel temperature is maintained at about 950° C. and the room temperature liquid $POCl_3$ is introduced to the diffusion tube. Since a glass layer is formed on the first polysilicon layer surface during the dopant diffusion, the wafer is immersed in an acid bath (wet etch or P-etch) to strip the glass layer. The acid bath is a solution of $HNO_3$ and HF according to Elliott, supra. A buffered HF etch is then used on the wafer as previously described.

To form a first polysilicon gate (poly gate #1) the photoresist layer is again applied to the front surface of the wafer using about 70 cps, exposing the photoresist using a Poly Gate 1 Mask, developing and baking at about 140° C. as previously described.

A plasma etch of the wafer, as described earlier, uses $CF_2Cl_2$ removes $N^+$ polysilicon (the polysilicon, heavily doped with phosphorous) leaving a polysilicon gate 1, 20a. The wafer is over-etched to remove 'stringers'. Subsequent to the etching, the photoresist is stripped using the oxygen plasma and acid method resulting in the device as shown in FIG. 11.

To prepare the wafer for a supplemental buried channel 16 implant, the wafer is cleaned with Standard Clean #1 using ultrasonic agitation. Boron atoms are then implanted in the buried channel region of the wafer using a dose of about 4E11 atoms per sq cm at an energy level of about 120 KeV with the buried channel and channel stop masking methods previously described. The implanting is followed by cleaning the wafer with Standard Clean #1 using ultrasonic agitation and Standard Clean #2.

A third thin silicon dioxide layer 22c is grown to a thickness of about 600 Å at a temperature of about 800° C. whereby the oxygen is introduced as steam using the method presented earlier. A helium (He) atmosphere is used at a temperature of about 900° C. to anneal the wafer.

Using the same method as used in the deposition of the first polysilicon layer, a second polysilicon layer 60b is deposited to a thickness of about 6500 Å at a temperature of about 560° C. Again, using the previous method, the photoresist layer is applied to the front surface of the wafer and baked at about 140° C. Then using the $CF_4+O_2+CF_3Cl$ plasma etch procedure the second polysilicon layer is stripped from the back surface of the wafer. Similarly, the third silicon dioxide layer is stripped from the back surface of the wafer using the $CHF_3+C_2F_6+He$ plasma etch procedure. The photoresist is then stripped using the oxygen plasma and acid method.

Figure 13:
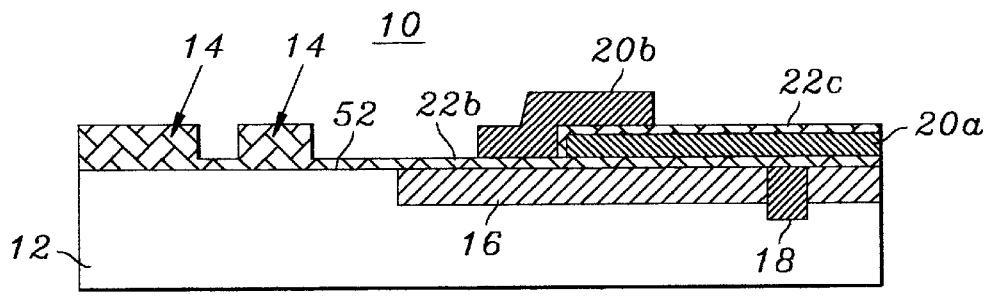
FIG. 13 shows a partial lateral sectional view of a basic wafer substrate showing the device of FIG. 12 with a second polysilicon gate formed.

After cleaning the wafer with Standard Clean #1 using ultrasonic agitation, $POCl_3$ is diffused as a dopant in the second polysilicon layer 60b of the wafer at a temperature of about 900° C. using the method of poly 1 gate. Similarly, the glass layer is stripped from the polysilicon layer surface using the P-etch procedure. The wafer is then etched in the buffered HF solution. Repeating the earlier process, the photoresist layer is applied to the front surface of the wafer using about 70 cps, exposed using a Poly Gate 2 Mask, developed and baked at about 140° C. Plasma etch of the wafer uses $CF_3Cl$ to remove the $N^+$ polysilicon, leaving a Poly Gate 2, as shown in FIG. 13; overetching to remove 'stringers' as in the previously described procedure. Stripping the photoresist uses the oxygen plasma and acid method. The third thin silicon dioxide layer 22c is removed at this point as previously described.

Following the cleaning of the wafer with Standard Clean #1 using ultrasonic agitation and Standard Clean #2, the fourth thin silicon dioxide layer is grown to a thickness of about 600 Å at a temperature of about 800° C. in steam as with the third silicon dioxide layer. The wafer is annealed in helium at a temperature of about 900° C. A third polysilicon layer 60c is then deposited to a thickness of about 6500 Å at a temperature of about 560° C., the photoresist layer is applied to the front surface of the wafer and baked at about 140° C.

Figure 14:
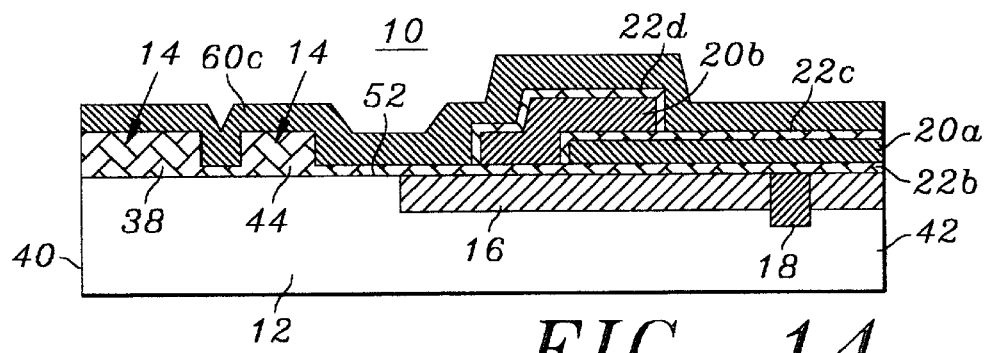
FIG. 14 shows a partial lateral sectional view of a basic wafer substrate showing the device of FIG. 13 with a third isolating silicon dioxide layer applied and overlayed with a third polysilicon gate layer.

Again, as in previous steps, stripping the third polysilicon layer from the back surface of the wafer uses the $CF_4+O_2+CF_3Cl$ plasma etch followed by stripping the fourth silicon dioxide layer 22d from the back surface of the wafer using the $CHF_3+C_2F_6+He$ plasma etch. Then the photoresist is stripped using the previously described method, leaving the device as shown in FIG. 14. Poly Gate 3, 20c, is then formed using the steps previously described for Poly Gate 2 with a Poly Gate 3 Mask for the photoresist.

After cleaning the wafer with Standard Clean #1 using ultrasonic agitation, a Standard Clean #1 without ultrasonic agitation and a Standard Clean #2, a fifth thin silicon dioxide layer 22e is grown to a thickness of about 150 Å using the method of previous steps.

As shown in FIG. 15 and using the process as described for the supplemental buried channel implant, but substituting the use of the Source and Drain Mask for exposure, the boron dopant is implanted in the source and drain region 24 at a density of about 5E15 atoms per sq cm with an energy level of about 60 KeV.

Following the cleaning of the wafer with Standard Clean #1 using ultrasonic agitation, the photoresist is applied using about 70 cps, exposed using an External Channel Stop Mask, developed and baked. The fifth thin silicon dioxide layer 22e is etched in buffered HF followed by a bake at about 140° C. Thereafter, arsenic (As) atoms are implanted in the external channel stop region of the wafer using a dose of about 5E15 atoms per sq cm at an energy level of about 140 KeV followed by a phosphorous implant in the external channel stop region 26 shown in FIG. 15 using a dose of about 5E13 atoms per sq cm at an energy level of about 120 KeV. The photoresist is stripped as in previous procedures, and the wafer cleaned using the Standard Clean #1 and Standard Clean #2. The wafer is annealed as before in nitrogen (N) at a temperature of about 900° C.

A sixth silicon dioxide layer 22f is grown to a thickness of about 300 Å at a temperature of about 800° C. as in the previous steps.

A deposit of the protective coating such as BPSG is applied to the front surface of the wafer to a thickness of about 10,000 Å using atmospheric chemical vapor deposition in the pressure vessel at approximately 400° C. followed by a cleaning with Standard Clean #2, then cleaning with de-ionized water using ultrasonic agitation.

The protective coating is then flowed at a temperature of about 900° C. for 15 minutes to provide a passivating coating for the wafer. Another photoresist layer is applied to the front surface of the wafer using about 70 cps, exposed using a Contact Mask, developed and baked. The protective coating layer 28 is plasma etched in $CHF_3$ and $C2F_6$. The photoresist is stripped using the prior method and the wafer cleaned with Standard Clean #2 followed by cleaning with de-ionized water using ultrasonic agitation. The protective coating 28 is then reflowed at a temperature of about 900° C. for about 15 minutes, forming the device shown in FIG. 16.

Application of the photoresist layer to the front surface of the wafer uses about 70 cps without a mask permits removal of the sixth thin silicon dioxide layer from the back surface of the wafer using a $CHF_3+C_2F_6+He$ plasma etch.

A seventh silicon dioxide layer 22g is grown on the back surface of the wafer to a thickness of about 100 Å in dry oxygen at a temperature of about 800° C. using the previous method. The back surface of the wafer is implanted with arsenic (As) atoms using a dose of about 2.5E14 per sq cm at an energy level of about 10 KeV and annealed first at about 850° C. for about 20 minutes and then at about 500° C. for about 20 minutes.

The seventh thin silicon dioxide layer 22g is stripped from the plurality of contact openings in the buffered HF solution. This step is followed by the sputter deposition of aluminum containing about 1% silicon metallization to a thickness of about 12,000 Å forming conductive contacts 30. The deposits are sintered at about 450° C. for about 20 mins.

A final application of the photoresist uses about 70 cps and a Metallization Mask for etching of the deposited aluminum.

The aluminum is chemically etched as in Elliott, supra, followed by the stripping of the photoresist using the oxygen plasma and acid method producing the final device 10 as shown in FIG. 1.

With the completion of the foregoing process, the devices 10 may be separated from the wafer in any desired pluralities of arrays by a diamond cutting procedure. Such arrays each possess the improved radiation resistant properties of the present invention and represent significant improvements over prior radiation resistant devices.

While a preferred method of production and the resulting device have been described in detail hereinabove, it is to be understood that such description is not intended to be restrictive of the present invention. Rather, the scope of the present invention is to be limited only by the following claims.

I claim:

1. In a p-type buried channel charge-coupled device for receiving and converting an optical energy signal into an electrical signal charge and comprising an N-type silicon substrate for supporting a plurality of layers comprising the device and for converting the optical energy signal into the electrical signal charge, a p-type buried channel region for accumulating the electrical signal charge from the N-type silicon substrate and for transporting the signal charge from a region where conversion from optical energy signal to electrical signal charge occurs to an output, improvements for rendering the device nuclear radiation induced displacement and ionization damage resistant comprising:

a dopant in the buried channel region for reducing radiation induced displacement damage therein comprising a plurality of an acceptor dopant atom which exceeds a plurality of a donor dopant atom.

2. The device of claim 1 wherein the plurality of the acceptor dopant atom comprise a plurality of a boron atom having a concentration sufficient to produce an acceptor concentration which exceeds the donor concentration in the buried channel region by about $3 \times 10^{12}$ atoms/cm$^2$.

3. The device of claim 2 wherein the plurality of the donor dopant atom comprise a plurality of a phosphorous atom.

4. The device of claim 1 wherein the plurality of the acceptor dopant atom comprise a plurality of a boron atom having a concentration of about 6E12/sq cm.

5. The device of claim 4 wherein the plurality of the donor dopant atom comprise a plurality of a phosphorous atom having a concentration of about 3E12/sq cm.

6. A p-type buried channel charge-coupled device for receiving and converting an optical energy signal into an electrical signal charge and comprising:

an n-type silicon substrate for supporting a plurality of layers comprising the device and for converting an optical energy signal into an electrical signal charge;

a p-type buried channel region for accumulating the electrical signal charge from the n-type silicon substrate and for transporting the signal charge from a region where conversion from optical energy signal to electrical signal charge occurs to an output;

a plurality of polysilicon gate layers for controlling the electrical signal charge and for transferring the electrical signal charge through the channel region to a plurality of external devices;

a plurality of isolating silicon dioxide layers each for electrically isolating adjacent ones of the gate layers of the device;

a source and drain region;

a protective covering for an outer exposed surface of the polysilicon gate layers for electrically isolating the outer exposed surface of the gate layers;

a plurality of conductive contacts each for interconnecting a selected device layer with a circuit and a voltage of one or more of the plurality of external devices; and a dopant in the buried channel region for reducing radiation induced displacement damage therein and comprising a plurality of an acceptor dopant atom, which exceeds a plurality of a donor dopant atom.

7. The device of claim 6 further comprising:

a first channel stop region for segmenting the buried channel region;

an insulator layer for electrically isolating the gate layers of the device from the silicon substrate; and a second channel stop region.

8. The device of claim 7 further comprising:

a silicon dioxide transfer layer on a back surface of the n-type substrate for accepting and transferring the optical energy therefrom into an interior of the n-type substrate in a back illuminated option of the device.

9. The device of claim 6 wherein the plurality of the acceptor dopant atom comprise a plurality of a boron atom having a concentration sufficient to produce an acceptor concentration which exceeds the donor dopant concentration in the buried channel region by about $3\times10^{12}$ atoms/cm$^2$.

10. The device of claim 9 wherein the plurality of the donor dopant atom comprise a plurality of a phosphorous atom.

11. The device of claim 6 wherein the plurality of the acceptor dopant atom comprise a plurality of a boron atom having a concentration of about 6E12/sq cm.

12. The device of claim 11 wherein the plurality of the donor dopant atom comprise a plurality of a phosphorous atom having a concentration of about 3E12/sq cm.

13. A charge coupled device (CCD) for imagers which are hardened against the deleterious effects of displacement damage caused by exposure to radiation, comprising:

a P-type buried channel CCD having a concentration of P-type dopant atoms greater than a concentration of N-type dopant atoms in its buried channel.

14. The CCD of claim 13 wherein the concentration of N-type dopant atoms, while less than that of the P-type dopant atoms is sufficient to interact with vacancies to for E-centers thereby reducing the density of divacancies that are formed in the buried channel upon exposure of the CCD to radiation capable of causing displacement damage and reducing the ability of divacancies to trap signal-carrying holes and degrade the CCD's Charge Transfer Efficiency.

* * * * *